US012719412B2

(12) United States Patent
Tsai

(10) Patent No.: US 12,719,412 B2
(45) Date of Patent: Aug. 25, 2026

(54) AUDIO SIGNAL AMPLIFYING DEVICE AND METHOD

(71) Applicant: REALTEK SEMICONDUCTOR CORPORATION, Hsinchu (TW)

(72) Inventor: Chia-Chi Tsai, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 461 days.

(21) Appl. No.: 18/368,033

(22) Filed: Sep. 14, 2023

(65) Prior Publication Data

US 2024/0136978 A1 Apr. 25, 2024
US 2024/0235482 A9 Jul. 11, 2024

(30) Foreign Application Priority Data

Oct. 25, 2022 (TW) ................................. 111140524

(51) Int. Cl.
*H03G 3/20* (2006.01)
*H03F 1/02* (2006.01)

(52) U.S. Cl.
CPC ....... *H03F 1/0222* (2013.01); *H03F 2200/03* (2013.01); *H03F 2200/102* (2013.01)

(58) Field of Classification Search
CPC ............... H03F 1/0222; H03F 2200/03; H03F 2200/102; H03F 2200/511; H03F 3/187; H03F 3/45475; H04R 1/1091; H04R 3/00; H04R 2420/09
USPC ......................................... 330/127, 129, 136
See application file for complete search history.

(56) References Cited

U.S. PATENT DOCUMENTS 8,265,572 B2 9/2012 Kenington
10,090,808 B1 * 10/2018 Henzler ................ H03F 1/0216
10,686,407 B2 * 6/2020 Nomiyama ............... H03F 3/21
10,944,365 B2 * 3/2021 Khlat ........................ H03F 1/02
11,463,048 B2 * 10/2022 Henzler ................ H03F 1/3241
11,658,764 B2 * 5/2023 Leung ...................... H04K 3/22 455/1
2014/0312710 A1 10/2014 Li
2015/0194988 A1 7/2015 Yan et al.
2019/0074797 A1 * 3/2019 Briffa ...................... H03F 1/025

OTHER PUBLICATIONS

OA letter of a counterpart TW application (appl. No. 111140524) mailed on Jun. 15, 2023.

* cited by examiner

*Primary Examiner* — Khanh V Nguyen
(74) *Attorney, Agent, or Firm* — WPAT, PC

(57) ABSTRACT

An audio signal amplifying device processes an input signal to provide an output signal for a balanced headphone. The device includes a signal detection circuit, a voltage supply circuit, and an amplifying circuit. The signal detection circuit detects the variation in the input signal to generate a detection result. The voltage supply circuit outputs one of multiple voltages as a supply voltage according to the detection result; when the detection result indicates the amplitude of the input signal satisfying a first condition, the supply voltage is a first voltage; when the detection result indicates the amplitude of the input signal satisfying a second condition, the supply voltage is a second voltage lower than the first voltage; and the amplitude satisfying the first condition is greater than the amplitude satisfying the second condition. The amplifying circuit generates the output signal according to the input signal based on the supply voltage.

8 Claims, 9 Drawing Sheets

110

110

AUDIO SIGNAL AMPLIFYING DEVICE AND METHOD

BACKGROUND OF THE INVENTION

1. Field of the Invention

The present disclosure relates to an audio signal processing device and an audio signal processing method, especially to an audio signal amplifying device and an audio signal amplifying method.

2. Description of Related Art

A headphone with a 3.5 mm plug (hereinafter referred to as "3.5 mm headphone") can be applied to many kinds of electronic products such as a tablet computer, a laptop computer, and a cell phone. However, the size of the 3.5 mm plug is large, and this is unfavorable for the design of miniaturized products. In addition, the performance of the 3.5 mm headphone is limited in terms of linearity and crosstalk due to its 3.5 mm plug, and this is hard to be improved. It is noted that the configuration of the audio signal amplifier of a general 3.5 mm headphone is usually a single-ended configuration with a charge pump. Through the adjustment of the output voltage of the charge pump, the energy conservation of the audio signal amplifier can be improved.

In recent years, a headphone with a balanced interface (e.g., a headphone with a USB Type-C interface, a headphone with a Lightning interface, or a Bluetooth headphone) gradually replaced a 3.5 mm headphone due to the demand for lightweight and waterproof features. A balanced headphone is characterized by good sound quality, low crosstalk interference, etc., and eliminates the need for the charge pump, which can save circuit area, die cost, bill of material (BOM) cost, etc. However, the balanced headphone cannot save power consumption through a dynamic adjustment in the output voltage of the charge pump.

SUMMARY OF THE INVENTION

An object of the present disclosure is to provide an audio signal amplifying device and method which can improve the power consumption on an audio signal amplifying operation through the dynamic adjustment in a supply voltage for the audio signal amplifying operation.

An embodiment of the audio signal amplifying device of the present disclosure is configured to process a differential input signal and thereby generate a differential output signal. The audio signal amplifying device of the present embodiment can be included in a signal generator (e.g., a playback device) for generating the differential input signal, or be included in a signal receiver (e.g., a balanced headphone) for receiving the differential output signal, or be a device independent of the signal generator and the signal receiver. This embodiment includes a signal detection circuit, a voltage supply circuit, and an amplifying circuit. The signal detection circuit is configured to detect the variation in the amplitude of the differential input signal and thereby generate a detection result. The voltage supply circuit is configured to outputs one of multiple voltages as a supply voltage according to the detection result. When the detection result indicates that the amplitude of the differential input signal satisfies a first condition, the supply voltage is a first voltage of the multiple voltages; and when the detection result indicates that the amplitude of the input signal satisfies a second condition, the supply voltage is a second voltage of the multiple voltages, wherein the second voltage is lower than the first voltage, the amplitude of the differential input signal satisfying the first condition is a first amplitude, the amplitude of the differential input signal satisfying the second condition is a second amplitude, and the first amplitude is greater than the second amplitude. The amplifying circuit is configured to receive the supply voltage, then process the differential input signal according to the supply voltage, and then generate the differential output signal. Accordingly, the present embodiment can improve the energy conservation of the audio signal amplifying device through the dynamic adjustment in the supply voltage.

An embodiment of the audio signal amplifying method is configured to process a differential input signal and thereby provide a differential output signal. The method of the present embodiment is executed by an audio signal amplifying device which can be included in a signal generator (e.g., a playback device) for generating the differential input signal, or be included in a signal receiver (e.g., a balanced headphone) for receiving the differential output signal, or be a device independent of the signal generator and the signal receiver. This embodiment includes the following steps: detecting the variation in the amplitude of the differential input signal and thereby generating a detection result; outputting one of multiple voltages as a supply voltage according to the detection result, wherein when the detection result indicates that the amplitude of the differential input signal satisfies a first condition, the supply voltage is a first voltage of the multiple voltages, and when the detection result indicates that the amplitude of the input signal satisfies a second condition, the supply voltage is a second voltage of the multiple voltages lower than the first voltage; and processing the differential input signal according to the supply voltage and thereby generating the differential output signal, wherein the amplitude of the differential input signal satisfying the first condition is a first amplitude, the amplitude of the differential input signal satisfying the second condition is a second amplitude, and the first amplitude is greater than the second amplitude. Accordingly, the present embodiment can improve the energy conservation of the audio signal amplifying device through the dynamic adjustment in the supply voltage.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present specification discloses an audio signal amplifying device and an audio signal amplifying method. This device and method can dynamically adjust a supply voltage for an audio signal amplifying operation to improve power consumption on the audio signal amplifying operation. This device and method can further adjust a common-mode voltage for the audio signal amplifying operation to increase headroom of an output signal of the audio signal amplifying operation.

Figure 1:
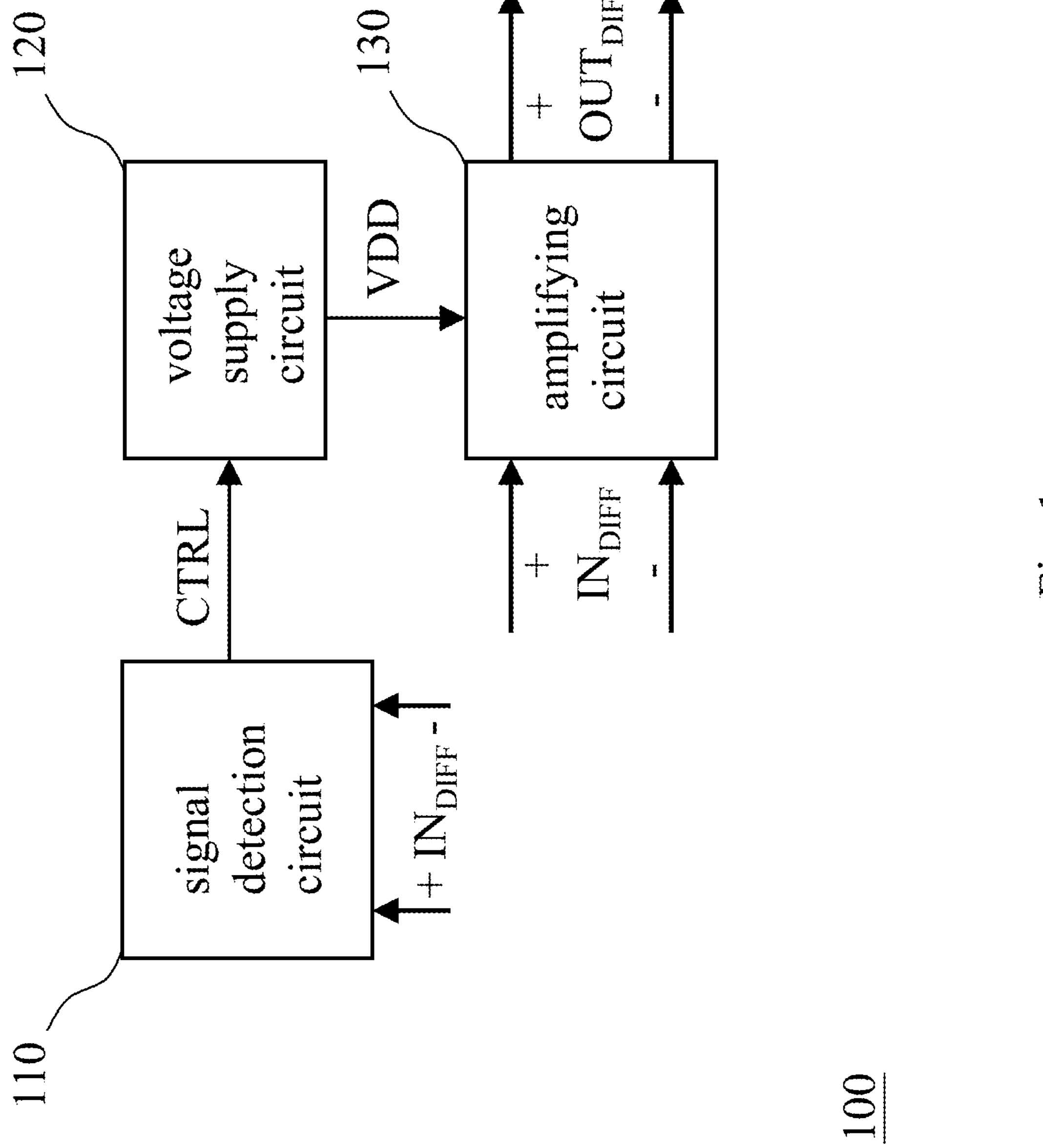
FIG. 1 shows an embodiment of the audio signal amplifying device of the present disclosure.

FIG. 1 shows an embodiment of the audio signal amplifying device of the present disclosure. The audio signal amplifying device 100 of FIG. 1 is configured to process a differential input signal $IN_{DIFF}$ and thereby generate a differential output signal $OUT_{DIFF}$, wherein a ratio of the differential output signal $OUT_{DIFF}$ to the differential input signal $IN_{DIFF}$ can be less than one, equal to one, or greater than one. In an exemplary implementation, the differential input signal $IN_{DIFF}$ is originated form a playback device (e.g., a cell phone, a tablet computer, a laptop computer, or an audio host). In an exemplary implementation, the differential output signal $OUT_{DIFF}$ is provided for a balanced headphone (e.g., a headphone with a USB (e.g., USB Type-C) interface, a headphone with a Lightning interface, or a Bluetooth headphone). The audio signal amplifying device 100 can be a device independent of the playback device and the balanced headphone, or be included in the playback device or the balanced headphone. The playback device can be coupled with the balanced headphone in a wired manner (i.e., a physical connection manner) or a wireless manner (i.e., a wireless connection manner). The audio signal amplifying device 100 includes a signal detection circuit 110, a voltage supply circuit 120, and an amplifying circuit 130. These circuits are described in the following paragraphs.

Figure 2:
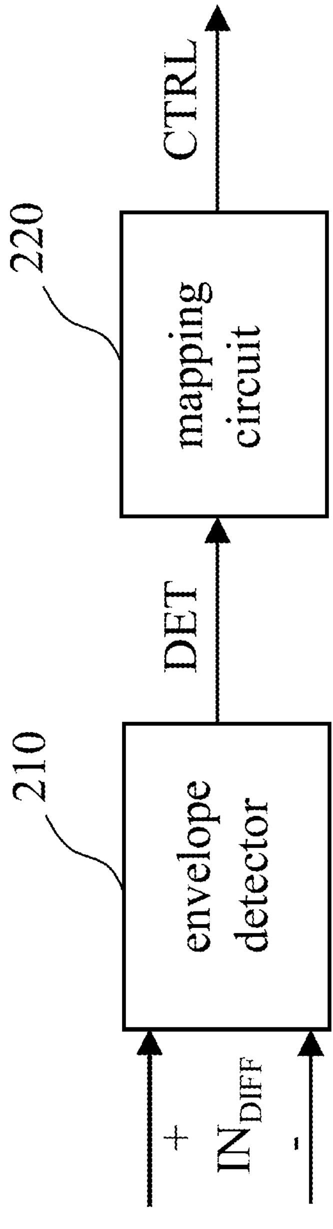
FIG. 2 shows an exemplary implementation of the signal detection circuit of FIG. 1.
Figure 3:
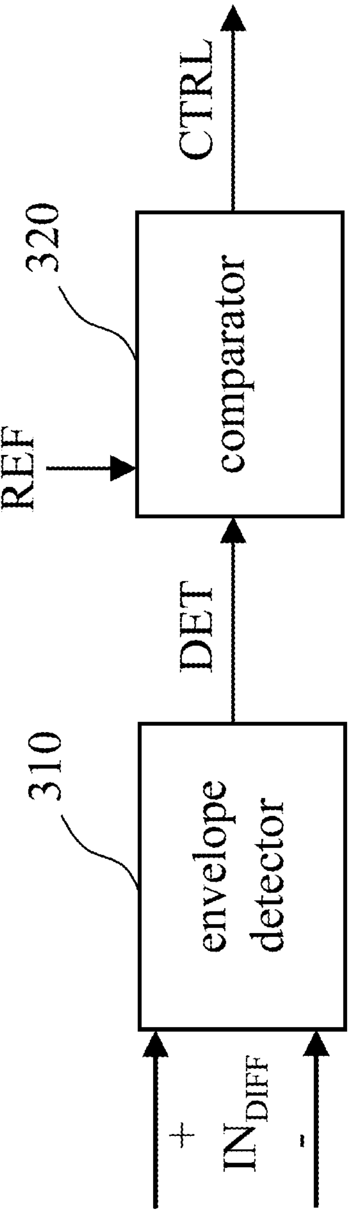
FIG. 3 shows another exemplary implementation of the signal detection circuit of FIG. 1.

Referring to FIG. 1, the signal detection circuit 110 is configured to detect a variation in an amplitude of the differential input signal $IN_{DIFF}$ and thereby generate a detection result CTRL. An embodiment of the signal detection circuit 110 is an envelope detection circuit or some known/self-developed amplitude detection circuit capable of detecting variations in signals. FIG. 2 shows an exemplary implementation of the envelope detection circuit. As shown in FIG. 2, the envelope detection circuit (i.e., the signal detection circuit 110) includes an envelope detector 210 and a mapping circuit 220. The envelope detector 210 is configured to output a detection signal DET according to the variation in the amplitude of the differential input signal $IN_{DIFF}$. The mapping circuit 220 (e.g., a look-up table) is configured to store multiple preselected results and to output one of the multiple preselected results as the detection result CTRL according to the detection signal DET. FIG. 3 shows another exemplary implementation of the envelope detection circuit. As shown in FIG. 3, the envelope detection circuit (i.e., the signal detection circuit 110) includes an envelope detector 310 and a comparator 320. The envelope detector 310 is configured to output the detection signal DET according to the variation in the amplitude of the differential input signal $IN_{DIFF}$. The comparator 320 is configured to compare the detection signal DET with at least one reference signal REF and thereby generate the detection result CTRL.

Referring to FIG. 1, the voltage supply circuit 120 is configured to output one of multiple voltages as a supply voltage VDD according to the detection result CTRL. When the detection result CTRL indicates the amplitude of the differential input signal $IN_{DIFF}$ satisfies a first condition, the supply voltage VDD is a first voltage VDDH (e.g., 1.8V) of the multiple voltages. When the detection result CTRL indicates the amplitude of the differential input signal $IN_{DIFF}$ satisfies a second condition, the supply voltage is a second voltage VDDL (e.g., 1.2V) of the multiple voltages. The second voltage is lower than the first voltage (e.g., the second voltage is lower than 75% of the first voltage). Normally, the first voltage VDDH and the second voltage VDDL can be determined according to which voltage sources the system (i.e., the system including the audio signal amplifying device 100) can provide. A difference between VDDH and VDDL is proportional to power saving effect. Providing the power consumption can be reduced, there is no specific requirement for the difference between VDDH and VDDL. In an exemplary implementation, the amplitude of the differential input signal $IN_{DIFF}$ satisfying the first condition is a first amplitude, the amplitude of the differential input signal $IN_{DIFF}$ satisfying the second condition is a second amplitude, and the first amplitude is greater than the second amplitude. For example, when the detection result CTRL indicates a high level, it means the first condition is satisfied; when the detection result CTRL indicates a low level, it means the second condition is satisfied; the first condition is that the amplitude of the differential input signal $IN_{DIFF}$ is higher than a predetermined threshold; and the second condition is that the amplitude of the differential input signal $IN_{DIFF}$ is lower than the predetermined threshold. It is noted that the multiple voltages can be two or more kinds of voltages; those having ordinary skill in the art can appreciate that these multiple voltages are corresponding to their respective conditions, and in this way one voltage of the multiple voltages is used as the supply voltage VDD when the condition corresponding to this voltage is satisfied.

Figure 4:
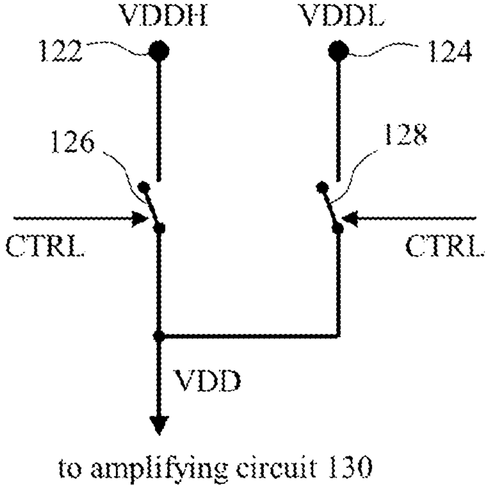
FIG. 4 shows an embodiment of the voltage supply circuit of FIG. 1.

FIG. 4 shows an embodiment of the voltage supply circuit 120. As shown in FIG. 4, the voltage supply circuit 120 includes a first voltage terminal 122, a second voltage terminal 124, a first switch 126, and a second switch 128. The first voltage terminal 122 is used for providing the first voltage VDDH. The second voltage terminal 124 is used for providing the second voltage VDDL. The first switch 126 is coupled between the first voltage terminal 122 and the amplifying circuit 130. The first switch 126 is configured to be turned on when the detection result CTRL indicates the amplitude of the differential input signal $IN_{DIFF}$ satisfies the first condition, and configured to be turned off when the detection result CTRL indicates the amplitude of the differential input signal $IN_{DIFF}$ satisfies the second condition. The second switch 128 is coupled between the second voltage terminal 124 and the amplifying circuit 130. The second switch 128 is configured to be turned off when the detection result CTRL indicates the amplitude of the differential input signal $IN_{DIFF}$ satisfies the first condition, and configured to be turned on when the detection result CTRL indicates the amplitude of the differential input signal $IN_{DIFF}$ satisfies the second condition. In an exemplary implementation, both the first switch 126 and the second switch 128 are the same kind of transistors (e.g., PMOS transistors), wherein the first switch 126 is configured to be turned on/off according to the voltage signal of the detection result CTRL while the second switch 128 is configured to be turned off/on according to the inversion of the voltage signal.

Referring to FIG. 1, the amplifying circuit 130 is configured to receive the supply voltage VDD and then process the differential input voltage $IN_{DIFF}$ according to the supply voltage VDD so as to generate the differential output signal $OUT_{DIFF}$. It is noted that when the high supply voltage and the low supply voltage for the voltage supply terminals of the amplifying circuit 130 are the supply voltage VDD and a ground voltage (i.e., 0V), respectively, the differential output signal $OUT_{DIFF}$ is established based on a common-mode voltage in a cycle of the differential output signal $OUT_{DIFF}$, wherein the common-mode voltage is usually a half of the supply voltage VDD $$\left(\text{i.e., } \frac{VDD}{2}\right).$$

Figure 5:
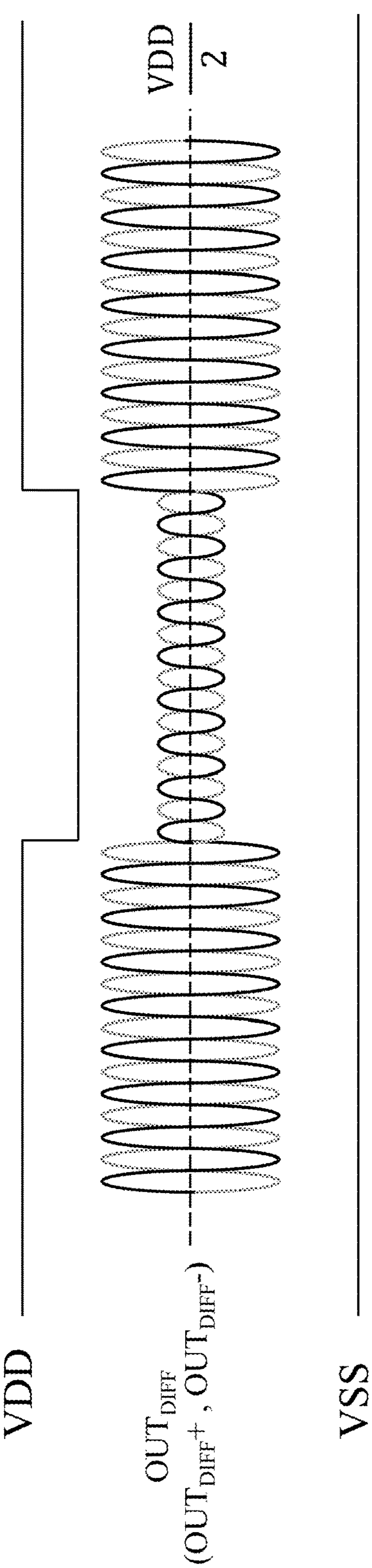
FIG. 5 shows the relationship between the supply voltage of FIG. 1 and the waveform of the differential output signal of FIG. 1.

To sum up, when the amplitude of the differential input signal $IN_{DIFF}$ is large, the audio signal amplifying device 100 provides the higher first voltage VDDH as the supply voltage VDD to ensure the amplifying circuit 130 can output the differential output signal $OUT_{DIFF}$ of a full swing; and when the amplitude of the differential input signal $IN_{DIFF}$ is small, the audio signal amplifying device 100 provides the lower second voltage VDDL as the supply voltage VDD to reduce the power consumption. In brief, through the dynamic adjustment of the supply voltage VDD, the audio signal amplifying device 100 can reduce the power consumption because: the power consumption on the audio signal amplifying operation of the audio signal amplifying device 100 depends on the supply voltage VDD and a current for the audio signal amplifying operation, and the power consumption is proportional to the supply voltage VDD when the current is fixed. The relationship between a waveform of the differential output signal $OUT_{DIFF}$ and the supply voltage VDD is illustrated with FIG. 5 (in FIG. 5, VDD is set for VDDH, then changed from VDDH to VDDL, and then changed from VDDL to VDDH), wherein the label VSS in FIG. 5 denotes a ground voltage.

Figure 6:
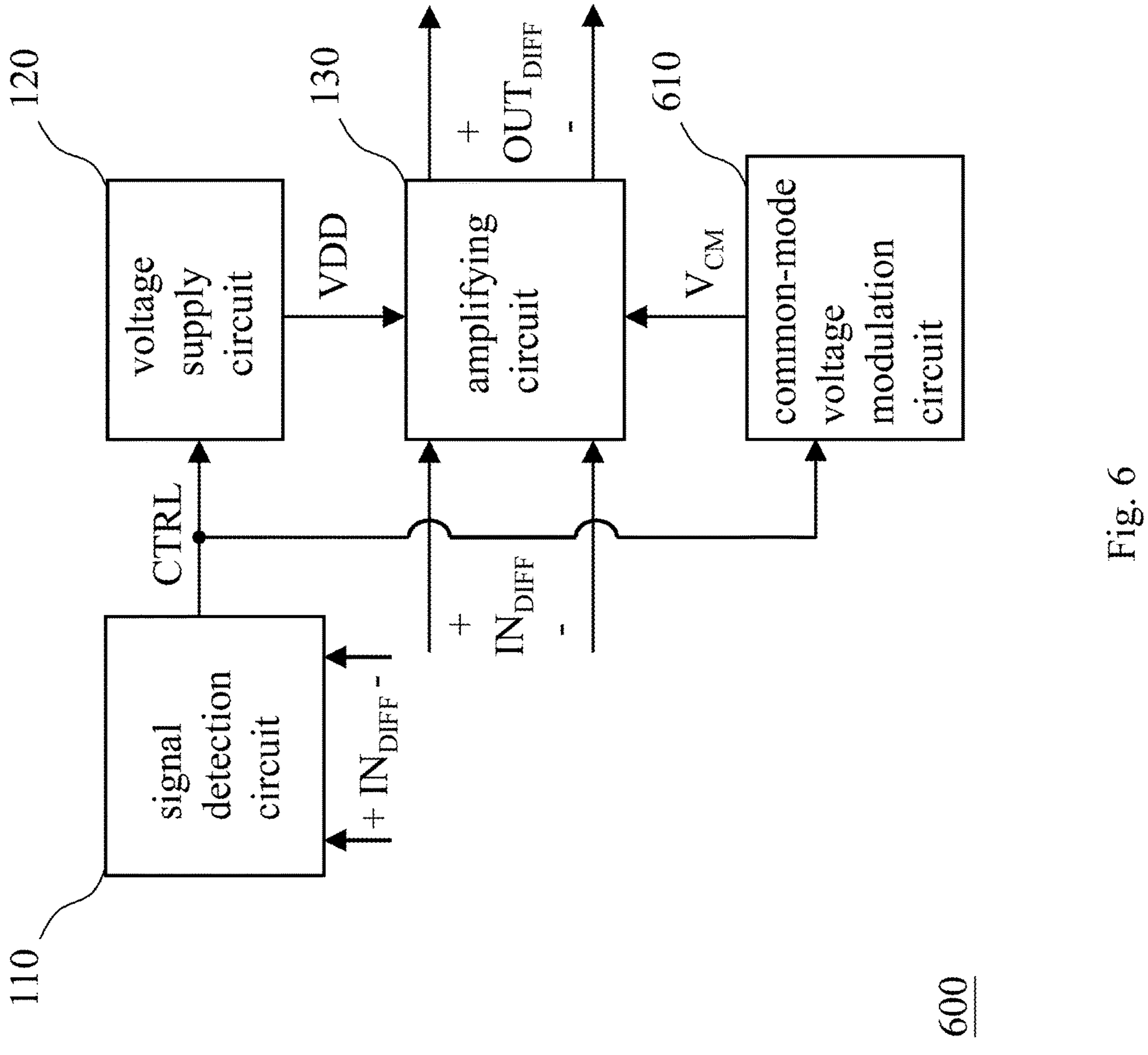
FIG. 6 shows another embodiment of the audio signal amplifying device of the present disclosure.

FIG. 6 another embodiment of the audio signal amplifying device of the present disclosure. Compared with FIG. 1, the audio signal amplifying device 600 of FIG. 6 further includes a common-mode voltage modulation circuit 610. The common-mode voltage modulation circuit 610 is configured to output one of multiple reference voltages as a common-mode voltage $V_{CM}$ for the amplifying circuit 130 in accordance with the detection result CTRL. When the detection result CTRL indicates the amplitude of the differential input signal $IN_{DIFF}$ satisfies the first condition, a first reference voltage $V_{REF1}$ of the multiple reference voltages is used as the common-mode voltage $V_{CM}$. When the detection result CTRL indicates the amplitude of the differential input signal $IN_{DIFF}$ satisfies the second condition, a second reference voltage $V_{REF2}$ of the multiple reference voltages is used as the common-mode voltage $V_{CM}$. The second reference voltage $V_{REF2}$ is lower than the first reference voltage $V_{REF1}$ $$\left(\text{e.g., } V_{REF2} = V_{REF1} - \Delta V;\ \Delta V = \frac{VDDH - VDDL}{2}\right).$$

Figure 7:
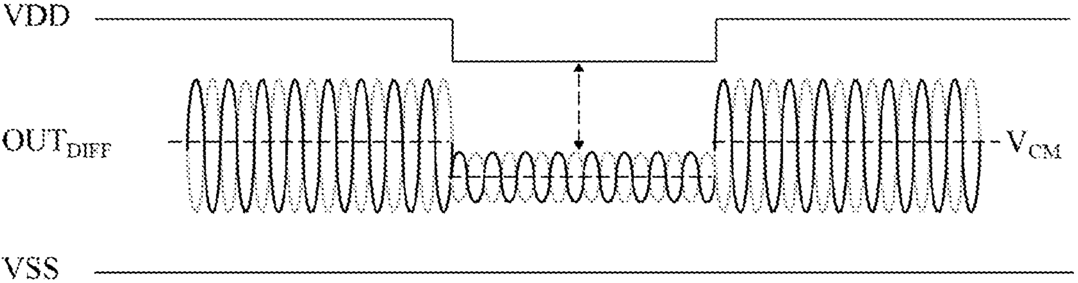
FIG. 7 shows the relationship between the common-mode voltage of FIG. 6 and the waveform of the differential output signal of FIG. 6.

In light of the above, when the amplitude of the differential input signal $IN_{DIFF}$ is large, the audio signal amplifying device 600 provides the higher first reference voltage $V_{REF1}$ as the common-mode voltage $V_{CM}$ to ensure the amplifying circuit 130 can output the differential output signal $OUT_{DIFF}$ normally; and when the amplitude of the differential input signal $IN_{DIFF}$ is small, the audio signal amplifying device 600 provides the lower second reference voltage $V_{REF2}$ as the common-mode voltage $V_{CM}$ to reduce the power consumption. The relationship between the waveform of the differential output signal $OUT_{DIFF}$ and the common-mode voltage $V_{CM}$ is illustrated with FIG. 7.

It is noted that the differential output signal $OUT_{DIFF}$ is composed of two complementary signals, and in a cycle of the differential output signal $OUT_{DIFF}$, a value of an average of the two complementary signals is equal to the value of the common-mode voltage $V_{CM}$. Based on the known knowledge, when the supply voltage VDD is lowered down and the common-mode voltage $V_{CM}$ is fixed, a headroom (i.e., a distance between a peak value of the differential output signal $OUT_{DIFF}$ and the value of the supply voltage VDD as illustrated with the arrowheaded dashed-line in FIG. 7) of the differential output signal $OUT_{DIFF}$ decreases, which means a swing of the differential output signal $OUT_{DIFF}$ is restricted. In consideration of the above-mentioned problem, the common-mode voltage modulation circuit 610 in FIG. 6 is used for lowering the common-mode voltage $V_{CM}$ down and thereby allows the headroom of the differential output signal $OUT_{DIFF}$ to increase correspondingly, which can optimize the amplitude of the differential output signal $OUT_{DIFF}$ according to the demand for implementation.

Figure 8:
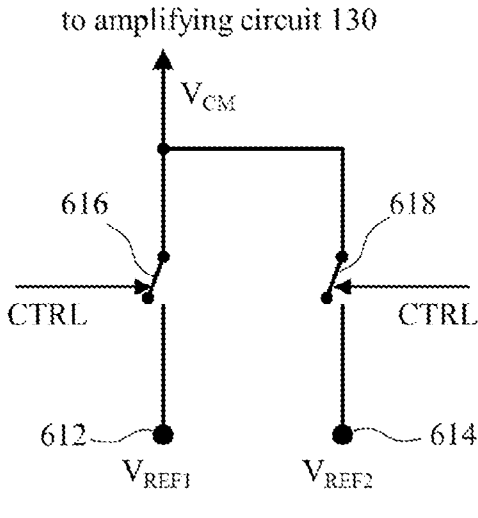
FIG. 8 shows an embodiment of the common-mode voltage modulation circuit of FIG. 6.

FIG. 8 shows an embodiment of the common-mode voltage modulation circuit 610. As shown in FIG. 8, the common-mode voltage modulation circuit 610 includes a first reference voltage terminal 612, a second reference voltage terminal 614, a first switch 616, and a second switch 618. The first reference voltage terminal 612 is used for providing the first reference voltage $V_{REF1}$. The second reference voltage terminal 614 is used for providing the second reference voltage $V_{REF2}$. The first switch 616 is coupled between the first reference voltage terminal 612 and the amplifying circuit 130; and the first switch 616 is configured to be turned on when the detection result CTRL indicates the amplitude of the differential input signal $IN_{DIFF}$ satisfies the first condition, and configured to be turned off when the detection result CTRL indicates the amplitude of the differential input signal $IN_{DIFF}$ satisfies the second condition. The second switch 618 is coupled between the second reference voltage terminal 614 and the amplifying circuit 130; and the second switch 618 is configured to be turned off when the detection result CTRL indicates the amplitude of the differential input signal $IN_{DIFF}$ satisfies the first condition, and configured to be turned on when the detection result CTRL indicates the amplitude of the differential input signal $IN_{DIFF}$ satisfies the second condition. In an exemplary implementation, both the first switch 616 and the second switch 618 are the same kind of transistors (e.g., PMOS transistors), wherein the first switch 616 is configured to be turned on/off according to the voltage signal of the detection result CTRL while the second switch 618 is configured to be turned off/on according to the inversion of the voltage signal.

Figure 9:
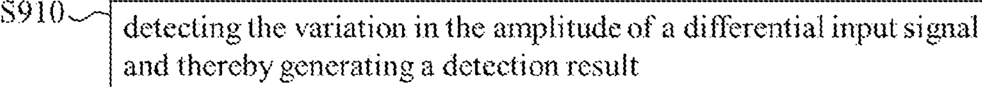
FIG. 9 shows an embodiment of the audio signal amplifying method of the present disclosure.

FIG. 9 shows an embodiment of the audio signal amplifying method of the present disclosure. This embodiment is executed by an audio signal amplifying device (e.g., the audio signal amplifying device 100 or 600), and is used for processing a differential input signal and thereby generating a differential output signal. The embodiment includes the following steps:

S910: detecting a variation in an amplitude of the differential input signal and thereby generating a detection result;

S920: outputting one of multiple voltages as a supply voltage according to the detection result, wherein when the detection result indicates that the amplitude of the differential input signal satisfies a first condition, the supply voltage is a first voltage of the multiple voltages, when the detection result indicates that the amplitude of the input signal satisfies a second condition, the supply voltage is a second voltage of the multiple voltages lower than the first voltage, and the amplitude of the differential input signal satisfying the first condition is greater than the amplitude of the differential input signal satisfying the second condition; and S930: processing the differential input signal according to the supply voltage and thereby generating the differential output signal.

Since those having ordinary skill in the art can refer to the device embodiments of FIGS. 1-8 to appreciate the detail and modification of the method embodiment of FIG. 9, repeated and redundant description is omitted here.

It is noted that people having ordinary skill in the art can selectively use some or all of the features of any embodiment in this specification or selectively use some or all of the features of multiple embodiments in this specification to implement the present invention as long as such implementation is practicable; in other words, the way to implement the present invention can be flexible based on the present disclosure. It is also noted that the description "A is equal to B" in this specification can be interpreted as "the difference between A and B falls within a tolerance range acknowledged in this technical field".

To sum up, the present invention can dynamically adjust a supply voltage and can optionally adjust a common-mode voltage to improve the energy conservation of an audio signal amplifying circuit for a balanced headphone.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An audio signal amplifying device configured to process a differential input signal and thereby generate a differential output signal, the audio signal amplifying device comprising:

a signal detection circuit configured to detect a variation in an amplitude of the differential input signal and thereby generate a detection result;

a voltage supply circuit configured to output one of multiple voltages as a supply voltage according to the detection result, wherein when the detection result indicates that the amplitude of the differential input signal satisfies a first condition, the supply voltage is a first voltage of the multiple voltages, and when the detection result indicates that the amplitude of the input signal satisfies a second condition, the supply voltage is a second voltage of the multiple voltages lower than the first voltage;

an amplifying circuit configured to receive the supply voltage, then process the differential input signal according to the supply voltage, and then generate the differential output signal; and a common-mode voltage modulation circuit configured to output one of multiple reference voltages as a common-mode voltage to the amplifying circuit in accordance with the detection result, wherein when the detection result indicates that the amplitude of the differential input signal satisfies the first condition, the common-mode voltage is a first reference voltage of the multiple reference voltages; when the detection result indicates that the amplitude of the differential input signal satisfies the second condition, the common-mode voltage is a second reference voltage of the multiple reference voltages; and the second reference voltage is lower than the first reference voltage, wherein the amplitude of the differential input signal satisfying the first condition is a first amplitude, the amplitude of the differential input signal satisfying the second condition is a second amplitude, and the first amplitude is greater than the second amplitude.

2. The audio signal amplifying device of claim 1, wherein the signal detection circuit is an envelope detection circuit.

3. The audio signal amplifying device of claim 2, wherein the envelope detection circuit comprises:

an envelope detector configured to output a detection signal according to the variation in the amplitude of the differential input signal; and a mapping circuit configured to store multiple preselected results and to output one of the multiple preselected results as the detection result in accordance with the detection signal.

4. The audio signal amplifying device of claim 2, wherein the envelope detection circuit comprises:

an envelope detector configured to output a detection signal according to the variation in the amplitude of the differential input signal; and a comparison circuit configured to compare the detection signal with at least one reference signal and thereby generate the detection result.

5. The audio signal amplifying device of claim 1, wherein the voltage supply circuit comprises:

a first voltage terminal configured to provide the first voltage;

a second voltage terminal configured to provide the second voltage;

a first switch coupled between the first voltage terminal and the amplifying circuit, the first switch configured to be turned on when the detection result indicates that the amplitude of the differential input signal satisfies the first condition, and configured to be turned off when the detection result indicates that the amplitude of the differential input signal satisfies the second condition; and a second switch coupled between the second voltage terminal and the amplifying circuit, the second switch configured to be turned off when the detection result indicates that the amplitude of the differential input signal satisfies the first condition, and configured to be turned on when the detection result indicates that the amplitude of the differential input signal satisfies the second condition.

6. The audio signal amplifying device of claim 1, wherein the common-mode voltage modulation circuit comprises:

a first reference voltage terminal configured to provide the first reference voltage;

a second reference voltage terminal configured to provide the second reference voltage;

a first switch coupled between the first reference voltage terminal and the amplifying circuit, the first switch configured to be turned on when the detection result indicates the amplitude of the differential input signal satisfies the first condition, and configured to be turned off when the detection result indicates the amplitude of the differential input signal satisfies the second condition; and a second switch coupled between the second reference voltage terminal and the amplifying circuit, the second switch configured to be turned off when the detection result indicates the amplitude of the differential input signal satisfies the first condition, and configured to be turned on when the detection result indicates the amplitude of the differential input signal satisfies the second condition.

7. The audio signal amplifying device of claim 1, the audio signal amplifying device being comprised in a playback device which outputs the differential output signal to a balanced headphone in a wired manner or a wireless manner.

8. An audio signal amplifying method configured to process a differential input signal and thereby provide a differential output signal, the audio signal amplifying method comprising:

detecting a variation in an amplitude of the differential input signal and thereby generating a detection result;

outputting one of multiple voltages as a supply voltage according to the detection result, wherein when the detection result indicates that the amplitude of the differential input signal satisfies a first condition, the supply voltage is a first voltage of the multiple voltages, and when the detection result indicates that the amplitude of the input signal satisfies a second condition, the supply voltage is a second voltage of the multiple voltages lower than the first voltage;

processing the differential input signal according to the supply voltage and thereby generating the differential output signal; and according to the detection result, providing one of multiple reference voltages as a common-mode voltage for processing the differential input signal, wherein when the detection result indicates that the amplitude of the differential input signal satisfies the first condition, the common-mode voltage is a first reference voltage of the multiple reference voltages; when the detection result indicates that the amplitude of the differential input signal satisfies the second condition, the common-mode voltage is a second reference voltage of the multiple reference voltages; and the second reference voltage is lower than the first reference voltage, wherein the amplitude of the differential input signal satisfying the first condition is a first amplitude, the amplitude of the differential input signal satisfying the second condition is a second amplitude, and the first amplitude is greater than the second amplitude.

* * * * *